(12) United States Patent
Wyatt et al.

(10) Patent No.: US 6,578,625 B1
(45) Date of Patent: Jun. 17, 2003

(54) METHOD AND APPARATUS FOR REMOVING HEAT FROM A PLATE

(75) Inventors: William Gerald Wyatt, Plano, TX (US); Jeffrey A. Gilstrap, Allen, TX (US); Gary J. Schwartz, Dallas, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/094,176

(22) Filed: Mar. 8, 2002

(51) Int. Cl.[7] .................................................. H05K 7/20
(52) U.S. Cl. ....................... 165/80.3; 165/121; 165/185; 174/16.3; 257/722; 361/697
(58) Field of Search ................................. 165/80.3, 121, 165/122, 185, 125; 174/16.3; 257/722; 361/703, 704, 697, 695

(56) References Cited

U.S. PATENT DOCUMENTS

| | | | | |
|---|---|---|---|---|
| 5,005,640 A | * | 4/1991 | Lapinski et al. | 165/185 |
| 5,365,400 A | * | 11/1994 | Ashiwake et al. | 165/80.3 |
| 5,494,098 A | * | 2/1996 | Morosas | 165/121 |
| 5,504,650 A | * | 4/1996 | Katsui et al. | 361/697 |
| 5,583,746 A | * | 12/1996 | Wang | 361/697 |
| 5,816,319 A | * | 10/1998 | Kamekawa et al. | 165/121 |
| 5,896,917 A | * | 4/1999 | Lemont et al. | 165/80.3 |
| 6,125,920 A | * | 10/2000 | Herbert | 165/80.3 |

OTHER PUBLICATIONS

U.S. patent application Ser. No. 10/164,523, filed Jun. 6, 2002, entitled "Method and Apparatus for Cooling a Circuit Component", 31 pages of text and 6 pages of drawings.

U.S. patent application Ser. No. 10/164,522, filed Jun. 6, 2002, entitled "Method and Apparatus for Cooling A Portable Computer", 32 pages of text and 6 pages of drawings.

* cited by examiner

Primary Examiner—Leonard R. Leo
(74) Attorney, Agent, or Firm—Baker Botts L.L.P.

(57) ABSTRACT

A cooling system (10) includes a member (26A, 26B) with an opening (27) therethrough, and includes first and second heat-conductive sections (21, 22) disposed adjacent the member on opposite sides thereof. A fluid supply section (41) is disposed on a side of the first section opposite from the member, and directs a flow of fluid (111–114) toward the first section. A portion (111, 114) of the fluid flows through the first section, and a different portion (112, 113) of the fluid flows through the other section.

20 Claims, 3 Drawing Sheets

METHOD AND APPARATUS FOR REMOVING HEAT FROM A PLATE

BACKGROUND OF THE INVENTION

There are existing applications that include a platelike part which receives heat from a device such as a thermoelectric cooler (TEC) or from high-temperature circuitry. A cooling system is provided to remove heat at a fairly high rate from the platelike part. One existing approach involves the provision of a single layer of fins which have been extruded or machined, which have a wide spacing, and which are relatively thick and tall. An air flow from a fan is directed into the middle of this configuration of fins. While this existing approach has been generally adequate for its intended purposes, it has not been satisfactory in all respects.

In this regard, the wide spacing of the fins must be maintained to achieve a low pressure drop, which makes it difficult to provide sufficient convection surface area to facilitate a high rate of heat transfer from the fins to the air flow. The thickness of the fins can also make it difficult to efficiently remove heat from the fins. Also, it is difficult to reliably control air flow past the fins in a manner which results in reasonably efficient and uniform heat transfer throughout the fins.

SUMMARY OF THE INVENTION

From the foregoing, it may be appreciated that a need has arisen for a method and apparatus for effecting cooling of a heat-conductive part, in a manner which avoids some or all the disadvantages of pre-existing arrangements. According to the present invention, a method and apparatus are provided to address this need, and involve: providing a member having an opening which extends therethrough in a first direction, and first and second sections which are spaced in the first direction, which are disposed adjacent the member on opposite sides thereof, and which are each heat conductive, the first section having a portion which is offset from the opening through the member in a second direction approximately perpendicular to the first direction, and the second section having a portion which is offset from the opening through the member in a third direction approximately perpendicular to the first direction. A fluid is caused to flow toward the first section approximately in the first direction, the fluid flow including a first fluid portion which subsequently flows along the portion of the first section approximately in the second direction to facilitate a transfer of heat from the first section to the first fluid portion, and the fluid flow including a second fluid portion which subsequently flows approximately in the first direction through the opening in the member, and then flows along the portion of the second section approximately in the third direction to facilitate a transfer of heat from the second section to the second fluid portion.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
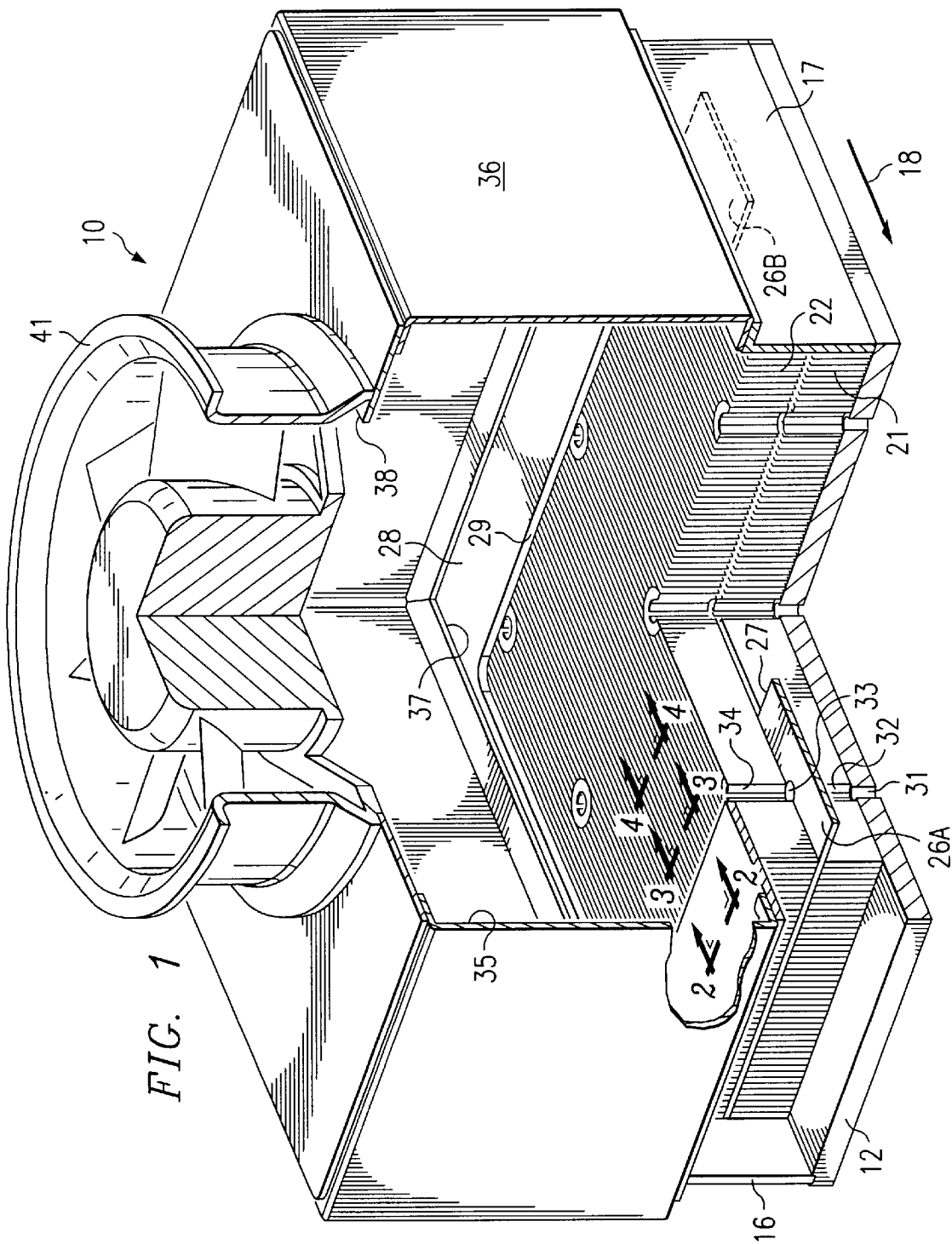
FIG. 1 is a diagrammatic perspective view of an apparatus which is a cooling system embodying the present invention, a portion of which has been cut away so that some internal structure is visible.

FIG. 1 is a diagrammatic view of an apparatus which is a cooling system 10, a portion of which is cut away so that some internal structure is visible. A coldplate in the form of a base plate 12 conducts heat, and is made of a material such as copper which is highly heat-conductive. The base plate 12 could alternatively be made of a different metal or some other suitable material. The base plate 12 receives heat from not-illustrated structure of a known type located below the base plate 12. The cooling system 10 dissipates heat from the base plate 12 into ambient air, in a manner discussed in more detail later.

The cooling system 10 includes two parallel side walls 16 and 17, which are vertical metal plates with their lower edges fixedly secured to opposite edges of the top surface of the base plate 12. In the disclosed embodiment, the side walls 16 and 17 are welded to the base plate 12, but they could alternatively be secured to the base plate 12 in any other suitable manner. The side walls 16 and 17 are made of metal, but could alternatively be made of any other suitable heat-conductive material. The vertical side walls 16 and 17 each extend parallel to a horizontal direction indicated by an arrow 18.

A lower finstock section 21 is disposed on the base plate 12, and an upper finstock 22 is disposed above the lower finstock section 21. The finstock sections 21 and 22 have the same length in a horizontal direction parallel to the direction 18. They also have the same width, such that each extends the full distance between the side walls 16 and 17. The finstock sections 21 and 22 each have approximately the same vertical height or thickness, the top of the finstock section 21 being approximately level with the tops of the side walls 16 and 17. The finstock sections 21 and 22 are each heat conductive, and the structure of each is described in more detail later.

Two lower splitter plate sections 26A and 26B are disposed vertically between the finstock sections 21 and 22, at locations which are spaced horizontally in the direction 18. Each of the lower splitter plate sections 26A and 26B is a rectangular plate of metal or some other suitable heat-conductive material, and each has one end disposed against the side wall 16 and the other end disposed against the side wall 17. The ends of the splitter plate sections 26A and 26B may be welded to the side walls 16 and 17. Although the splitter plate sections 26A and 26B are physically separate parts in the disclosed embodiment, for purposes of clarity they are treated herein as if they were respective portions of a single component. Therefore, they are sometimes referred to collectively herein as a lower splitter plate 26. The region between the splitter plate sections 26A and 26B serves as an opening 27 through the lower splitter plate 26.

The upper splitter plate 28 is approximately square, and is made of metal or some other suitable heat-conductive material. The upper splitter plate 28 has an approximately rectangular opening which extends vertically through it. The upper ends of the side walls 16 and 17 engage the underside of the splitter plate 28 adjacent opposite edges of the opening 29, and are fixedly secured to the plate 29 by welding or in some other suitable manner. It will be noted that the width of the opening 29 in the direction 18 is larger than the width of the opening 27 in the direction 18. Further, the opening 27 is approximately centered in relation to the opening 29 in the direction 18. It will also be noted that the finstock sections 21 and 22 each have portions which project outwardly beyond each of the openings 27 and 29 on each side of each opening, in directions parallel to the direction 18.

The base plate 12, lower finstock section 21, lower splitter plate 26 and upper finstock section 22 have several sets of aligned holes, one set of aligned holes being identified in FIG. 1 by reference numerals 31–34. A respective bolt, which is not illustrated, can be inserted through each set of aligned holes, in order to physically secure the base plate 12 to a not-illustrated thermal load plate which is located below the base plate 12. The head of each such bolt engages the top side of the base plate 12, and the threaded shank of the bolt extends downwardly through the opening 31 in the base plate 12 and engages a threaded opening in the thermal load plate. In order to facilitate heat transfer in the disclosed embodiment, the finstock sections 21 and 22 are each brazed to the lower splitter plate 26 and also to the base plate 12 or the upper splitter plate 28.

A plenum 36 is made of metal or some other suitable material, and is effectively a housing of approximately rectangular shape which has therein a chamber 35 of approximately rectangular shape. The plenum 36 has an approximately square opening 37 in the bottom wall thereof, and an approximately circular opening 38 in the top wall thereof. The opening 37 in the bottom wall is at least as wide and at least as long as the opening 29 in the upper splitter plate. The peripheral edges of the bottom wall of the plenum, which extend around the opening 37, engage the peripheral edges of the upper splitter plate 28, and are fixedly secured to the plate 28 by welding, or in some other suitable manner, such as by bolts.

An electric fan 41 of a commercially available type has a housing which is fixedly secured to the top wall of the plenum 36 by not-illustrated bolts, or in some other suitable manner. The fan 41 is aligned with the circular opening 38 in the top wall of the plenum 36, so that operation of the fan 41 will cause air to flow vertically downwardly through the fan and into the plenum 36.

Figure 2:
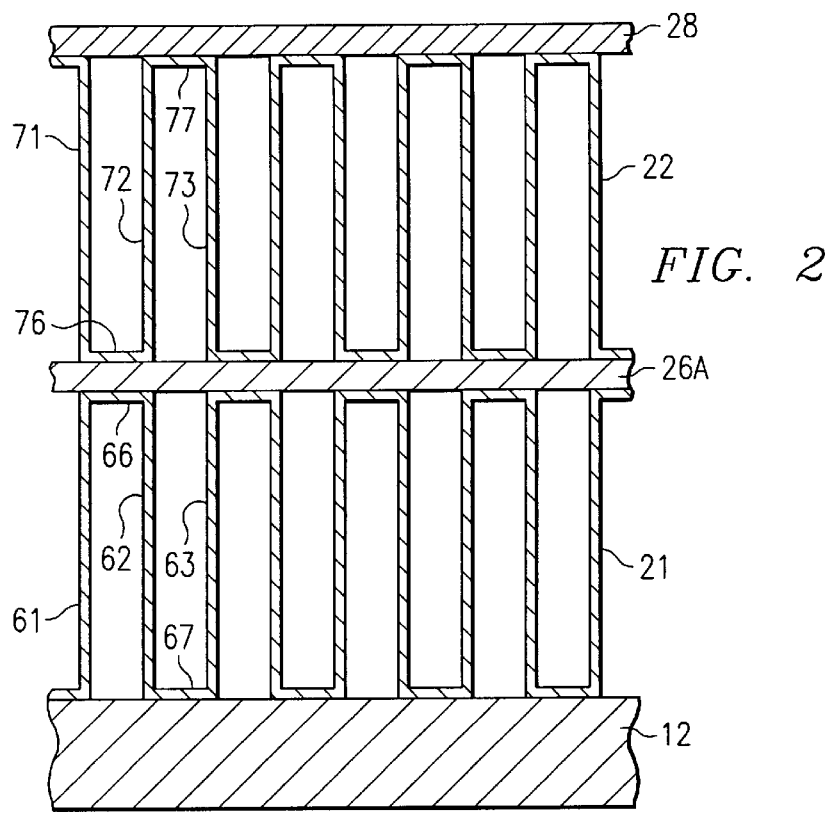
FIG. 2 is a diagrammatic sectional view taken along the section line 2—2 in FIG. 1.

FIG. 2 is a diagrammatic sectional side view taken along the line 2—2 in FIG. 1. FIG. 2 shows the base plate 12, lower splitter plate section 26A, upper splitter plate 28, and finstock sections 21 and 22. As evident from FIG. 2, the finstock sections 21 and 22 are each defined by a sheet of thin metal which is bent to have a corrugated shape similar to a square wave. In the disclosed embodiment, the metal of the corrugated sheets is approximately 0.006" thick, but it would alternatively be possible to use some other suitable thickness. Also, each of these corrugated sheets could alternatively be made of a suitable heat-conductive material other than metal.

Each of the corrugated sheets has a series of parallel vertical walls which are connected at their ends by bends. For example, the corrugated sheet of the lower finstock section 21 includes vertical walls 61, 62 and 63, the walls 61 and 62 being connected at their upper ends by a bend 66, and the walls 62 and 63 being connected at their lower ends by a bend 67. Similarly, three of the walls in the finstock section 22 are designated by reference numerals 71, 72 and 73, the walls 71 and 72 being connected at their lower ends by a bend 76, and the walls 72 and 73 being connected at their upper ends by a bend 77. Since the corrugated sheets each have approximately the shape of a square wave, the bends on the underside of the finstock section 21 each have a substantial surface area in contact with the base plate 12, so as to facilitate heat transfer from the base plate 12 to the finstock section 21. Similarly, the bends on the upper side of the finstock section 21 and the bends on the lower side of the finstock section 22 each have a substantial surface area in engagement with the splitter plate section 26A, so as to facilitate heat transfer.

Figure 3:
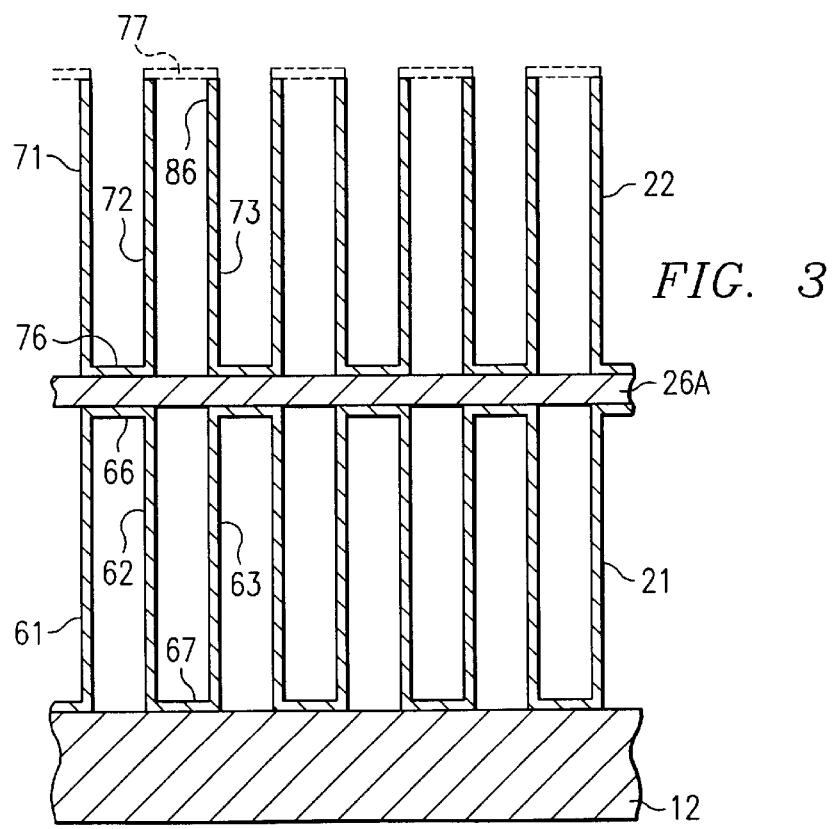
FIG. 3 is a diagrammatic sectional view taken along the section line 3—3 in FIG. 1.
Figure 4:
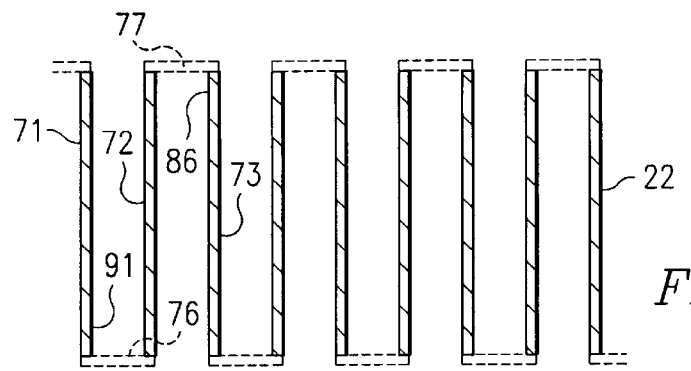
FIG. 4 is a diagrammatic sectional view taken along the section line 4—4 in FIG. 1.

FIG. 3 is a diagrammatic sectional view similar to FIG. 2, except it is taken along the section line 3—3 in FIG. 1. In this sectional view, the lower splitter plate section 26A is present, but the upper splitter plate 28 is not present, because this sectional view is taken within the opening 29 in the upper splitter plate 28. FIG. 4 is a diagrammatic sectional view similar to FIG. 2, except that it is taken along the section line 4—4 in FIG. 1. It will be noted that neither the lower splitter plate section 26A nor the upper splitter plate 28 is shown in FIG. 4, because the sectional view of FIG. 4 is taken at a location within each of the openings 27 and 29 of the splitter plates.

The top of the upper finstock section 22 has a region which is adjacent and aligned with the opening 29 in the upper splitter plate 28. Within this region, the bends on the upper side of the finstock section 22 have been removed using a known technique, such as electro-discharge machining (EDM). In FIGS. 3 and 4, the bends which have been removed by EDM are indicated by broken lines. Instead of viewing the removal of this material as complete removal of the bends, it can alternatively be viewed as the creation of slotlike openings within each bend, one example of which is the slotlike opening indicated by reference numeral 86 in FIGS. 3 and 4.

In a similar manner, the lower side of the upper finstock section 22 has a region which is aligned with the opening 27 in the lower splitter plate 26, and the bends within this region of the finstock section 22 have been removed by EDM, as indicated by broken lines in FIG. 4. This can alternatively be viewed as the creation of slotlike openings within each of these bends, one example of which is indicated by reference numeral 91 in FIG. 4. Further, the upper side of the lower finstock section 21 has a region which is adjacent and aligned with the opening 27 in the lower splitter plate 26, and the bends within this region have been removed by EDM, as indicated diagrammatically by broken lines in FIG. 4. This can alternatively viewed as the creation of slotlike openings within each of these bends, one example which is indicated by reference numeral 92. As to each of the finstock sections 21 and 22, material of the bends is removed only where the bends are adjacent and aligned with one of the openings 27 and 29 in the splitter plates. In all other portions of each finstock section, the bends are in place so that the bends can engage the base plate 12 or one of the splitter plates 26 and 28 in order to facilitate heat transfer, and in order to maintain structural rigidity of the finstock sections 21 and 22.

Figure 5:
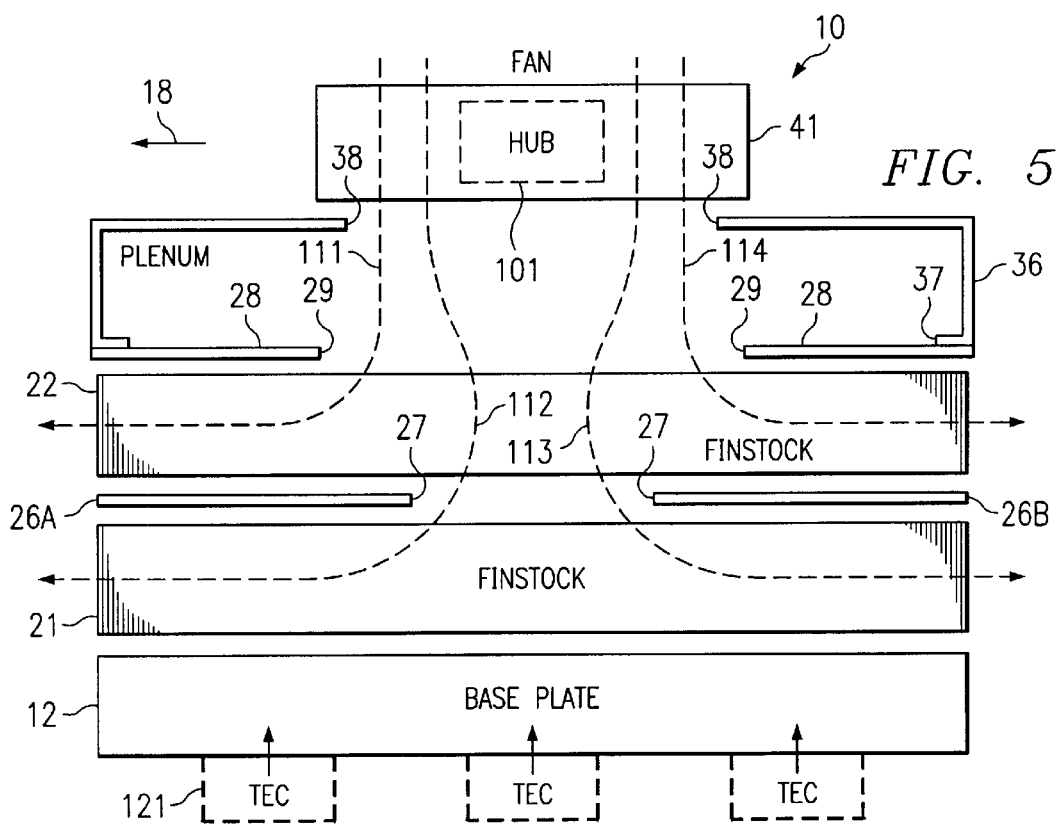
FIG. 5 is a diagram of the cooling system of FIG. 1, showing how air flows through the cooling system.

FIG. 5 is a diagrammatic view of the cooling system 10 of FIG. 1, for purposes of showing how air flows through the cooling system 10. FIG. 5 corresponds to a central portion of the cooling system 10, where the plane of FIG. 5 corresponds to a vertical plane extending parallel to the direction 18. The fan 41 has a rotating hub 101 in the center thereof, and air passes through the fan at locations disposed radially outwardly from the hub, as indicated diagrammatically by exemplary air flow lines 111–114. The air flow passes through the plenum 36, and through the opening 29 in the upper splitter plate 28. The air flow enters the region between vertical walls of the upper finstock section 22, facilitated by the slotlike openings 86 provided in the bends 77 on the upper side of the finstock section 22.

The outermost portions of the air flow, indicated by air flow lines 111 and 114, are routed to flow laterally outwardly in opposite directions through the upper finstock section 22, due in part to the fact that the opening 27 in the lower splitter plate 26 is not as wide as the opening 29 in the upper splitter plate 28. The central portion of the air flow passes through the opening 27 in the lower splitter plate 26, and enters the lower finstock section 21, due in part to the slotlike openings 91 and 92 provided in the bends 76 and 66 of the finstock sections 21 and 22. In view of the presence of the base plate 12, this air flow splits and respective portions of it flow horizontally in opposite directions through the lower finstock section 21, as indicated diagrammatically by air flow lines 112 and 113.

A plurality of thermoelectric coolers (TECs) 121 are provided on the underside of the base plate 12. Each TEC 121 is a commercially available component. Heat extracted from the region below the base plate 12 by the TECs 121 is transferred from the TECs to the base plate 12, and is then dissipated by the cooling system 10. The thermal load plate discussed earlier, which is not shown in the drawings, is disposed against the underside of the TECs 121, such that the TECs 121 are sandwiched between the base plate 12 and the thermal load plate.

For convenience and clarity, the foregoing discussion assumes that the TECs transfer heat to the cooling system 10, and that this heat is then transferred to the air flowing through the cooling system 10. However, it will be recognized that where the region below the base plate 12 needs to be heated, the direction of current flow through the TECs could be reversed so that the TECs extract heat from the base plate 12 and supply it to the region below the base plate. In that case, heat from the air flowing through the cooling system 10 will be transferred to the base plate 12.

The TECs 121 are shown in FIG. 12 by way of example. Persons skilled in the art will recognize that some other structure which is to be cooled or heated could be thermally coupled to the base plate 12. This other structure could cooperate with the underside of the base plate 12, or could be thermally coupled to it in some other manner.

As discussed above, the lower and upper finstocks 21 and 22 of the disclosed embodiment are made of bent metal sheets that have openings created by EDM techniques. However, it would alternatively be possible to form suitable finstocks by injection molding techniques, using an injection molding material of relatively high thermal conductivity. The molded finstocks would be somewhat less thermally conductive than the illustrated finstocks, and would typically have somewhat thicker fins. On the other hand, forming the finstocks by injection molding would permit the openings in the finstocks to be formed as part of the molding process, thereby avoiding the use of EDM techniques, which in turn would reduce the overall cost of the finstocks. A further consideration is that, as evident from FIGS. 1 and 4, there is a vertical gap between the sheet metal finstocks of the disclosed embodiment in the region of the opening 27 in the lower splitter plate 26. However, if the finstocks were injection molded, the upper side of the lower finstock and/or the lower side of the upper finstock could be shaped to have a portion that extends into the opening 27, in a manner so that there is little or no gap between the finstocks in the region of the opening 27.

The present invention provides a number of technical advantages. One such technical advantage results from the use of two finstock sections on opposite sides of a splitter plate with an opening through it, such that the amount of flow through each finstock section can be appropriately controlled with a minimal back pressure on the fan.

The width of the opening through the splitter plate disposed between the finstock sections serves as a control on the pressure drop and thus on the division of air flow between the finstock sections. Use of a thin corrugated sheet for each finstock section allows significantly more convection surface area for heat transfer than in the case of tall and/or thick fins of a type used in pre-existing systems. The use of parallel flow paths also facilitates a lower pressure drop for a given air flow.

Given that there is a minimal back pressure on the fan, a low-pressure, high-volume, low-noise fan can be used. This can be advantageous in environments where operators or other persons are present, by avoiding the need for such persons to wear ear protectors. A further advantage is that the disclosed cooling system is capable of removing a substantial amount of heat from the base plate, which in turn permits the cooling system to maintain a relatively uniform temperature throughout the base plate. The use of two layers of finstock provides a significantly increase in the convection heat transfer area, in comparison to pre-existing configurations.

Although one embodiment has been illustrated and described in detail, it will be understood that various substitutions and alterations are possible without departing from the spirit and scope of the present invention, as defined by the following claims.

What is claimed is:

1. An apparatus, comprising:
   a member having an opening which extends therethrough in a first direction;
   first and second sections which are spaced in said first direction, which are disposed adjacent said member on opposite sides thereof, and which are each heat conductive, said first section having a first portion which is aligned with said opening through said member and a second portion which is offset from said opening through said member in a second direction approximately perpendicular to said first direction, and said second section having a first portion which is aligned with said opening through said member and a second portion which is offset from said opening through said member in a third direction approximately perpendicular to said first direction, said first section having a plurality of fins which each extend across said first and second portions thereof approximately in said second direction, said second section having a plurality of fins which each extend across said first and second portions thereof approximately parallel to said third direction, and said first portion of said first section having therethrough a plurality of openings which are each disposed between an adjacent pair of said fins of said first section; and
   a fluid supply section disposed on a side of said first section opposite from said member, said supply section being operable to direct a fluid flow approximately in said first direction toward said first portion of said first section and toward said opening in said member, said fluid flow including a first fluid portion which subsequently flows along said fins in said first and second portions of said first section approximately in said second direction to facilitate a transfer of heat from said first section to said first fluid portion, and said fluid flow including a second fluid portion which subsequently flows approximately in said first direction through said openings in said first section and said opening in said member, and then flows along said fins in said first and second portions of said second section approximately in said third direction to facilitate a transfer of heat from said second section to said second fluid portion.

2. An apparatus according to claim 1, wherein said member is a platelike first part extending approximately normal to said first direction; and including a platelike second part extending approximately normal to said first direction adjacent said first section, said second part being disposed between said first section and said fluid supply section, and having an opening which extends therethrough approximately in said first direction and which is larger in cross-sectional size than said opening through said first part.

3. An apparatus according to claim 2, including a plenum disposed between said fluid supply section and said second part to guide said fluid flow in said first direction from said fluid supply device to said opening in said second part.

4. An apparatus according to claim 2, wherein said opening in said first part is substantially aligned with said opening in said second part.

5. An apparatus according to claim 1, wherein said first section has a third portion which is disposed on a side of said first portion thereof opposite from said second portion thereof, and which is offset from said opening through said member in a fourth direction opposite from said second direction, said fins of said first section extending across said third portion thereof approximately parallel to said second and fourth directions;

wherein said second section has a third portion which is disposed on a side of said first portion thereof opposite from said second portion thereof, and which is offset from said opening through said member in a fifth direction opposite from said third direction, said fins of said second section extending across said third portion thereof approximately parallel to said third and fifth directions;

wherein said fluid flow includes a third fluid portion which subsequently flows along said fins in said first and third portions of said first section approximately in said fourth direction to facilitate a transfer of heat from said first section to said third fluid portion; and wherein said fluid flow includes a fourth fluid portion which subsequently flows approximately in said first direction through said opening in said member, and which then flows along said fins in said first and third portions of said second section approximately in said fifth direction to facilitate a transfer of heat from said second section to said fourth fluid portion.

6. An apparatus according to claim 5, wherein said second, third, fourth and fifth directions are approximately parallel to each other.

7. An apparatus according to claim 1, wherein said first section includes a corrugated part, and wherein said openings through said first section are provided through regions of bends thereof which are on a side thereof adjacent said member.

8. An apparatus according to claim 7, wherein said member is a platelike first part extending approximately normal to said first direction;

including a platelike second part extending approximately normal to said first direction adjacent said first section, said second part being disposed between said first section and said fluid supply section, and said second part having an opening which extends therethrough approximately in said first direction and which is larger in cross-sectional size than said opening through said first part; and wherein said corrugated part of said first section has openings through regions of bends thereof which are on a side thereof adjacent said second part and which are aligned with said opening through said second part.

9. An apparatus according to claim 8, wherein said second section includes a corrugated part having openings through regions of bends thereof which are on a side thereof adjacent said first part and which are aligned with said opening through said first part.

10. An apparatus, comprising:

a member having an opening which extends therethrough in a first direction;

first and second sections which are spaced in said first direction, which are disposed adjacent said member on opposite sides thereof, and which are each heat conductive, said first section having a portion which is offset from said opening through said member in a second direction approximately perpendicular to said first direction, and said second section having a portion which is offset from said opening through said member in a third direction approximately perpendicular to said first direction; and a fluid supply section disposed on a side of said first section opposite from said member, said supply section being operable to direct a fluid flow toward said first section approximately in said first direction, said fluid flow including a first fluid portion which subsequently flows along said portion of said first section approximately in said second direction to facilitate a transfer of heat from said first section to said first fluid portion, and said fluid flow including a second fluid portion which subsequently flows approximately in said first direction through said opening in said member, and then flows along said portion of said second section approximately in said third direction to facilitate a transfer of heat from said second section to said second fluid portion;

wherein said first section includes a corrugated part having openings through regions of bends thereof which are on a side thereof adjacent said member and which are aligned with said opening through said member.

11. An apparatus according to claim 10, including a heat conductive section disposed adjacent said second section on a side thereof opposite from said first section, said first and second sections each receiving heat from said heat conductive section.

12. An apparatus according to claim 10, wherein said member is a platelike first part extending approximately normal to said first direction; and including a platelike second part extending approximately normal to said first direction adjacent said first section, said second part being disposed between said first section and said fluid supply section, and having an opening which extends therethrough approximately in said first direction and which is larger in cross-sectional size than said opening through said first part.

13. An apparatus according to claim 12, including a plenum disposed between said fluid supply section and said second part to guide said fluid flow in said first direction from said fluid supply device to said opening in said second part.

14. An apparatus according to claims 12, wherein said opening in said first part is substantially aligned with said opening in said second part.

15. An apparatus according to claim 10,
wherein said first section has a further portion which is offset from said opening through said member in a fourth direction opposite from said second direction;
wherein said second section has a further portion which is offset from said opening in said member in a fifth direction opposite from said third direction;
wherein said fluid flow includes a third fluid portion which subsequently flows along said further portion of said first section approximately in said fourth direction to facilitate a transfer of heat from said first section to said third fluid portion; and
wherein said fluid flow includes a fourth fluid portion which subsequently flows approximately in said first direction through said opening in said member, and then flows along said further portion of said second section approximately in said fifth direction to facilitate a transfer of heat from said second section to said fourth fluid portion.

16. An apparatus according to claim 15, wherein said second, third, fourth and fifth directions are approximately parallel to each other.

17. An apparatus according to claim 10,
wherein said member is a platelike first part extending approximately normal to said first direction;
including a platelike second part extending approximately normal to said first direction adjacent said first section, said second part being disposed between said first section and said fluid supply section, and said second part having an opening which extends therethrough approximately in said first direction and which is larger in cross-sectional size than said opening through said first part; and
wherein said corrugated part of said first section has openings through regions of bends thereof which are on a side thereof adjacent said second part and which are aligned with said opening through said second part.

18. An apparatus according to claim 17, wherein said second section includes a corrugated part having openings through regions of bends thereof which are on a side thereof adjacent said first part and which are aligned with said opening through said first part.

19. An apparatus according to claim 10, wherein said fluid supply section includes a fan and said fluid flow includes air.

20. An apparatus according to claim 10, including a further section which supplies heat to each of said first and second sections.

* * * * *

UNITED STATES PATENT AND TRADEMARK OFFICE
CERTIFICATE OF CORRECTION

PATENT NO.    : 6,578,625 B1                                              Page 1 of 1
DATED         : June 17, 2003
INVENTOR(S)   : William Gerald Wyatt et al.

It is certified that error appears in the above-identified patent and that said Letters Patent is hereby corrected as shown below:

<u>Column 1,</u>
Line 5, before "BACKGROUND OF THE INVENTION" insert
-- TECHNICAL FIELD OF THE INVENTION
  This invention relates in general to cooling techniques and, more particularly, to a cooling system capable of removing heat from a heat-conductive part. --.

Signed and Sealed this

Second Day of March, 2004

JON W. DUDAS
*Acting Director of the United States Patent and Trademark Office*